United States Patent
Hackenbuchner et al.

(10) Patent No.: US 7,625,237 B2
(45) Date of Patent: Dec. 1, 2009

(54) LAMP BASE AND HIGH-PRESSURE DISCHARGE LAMP WITH BASE

(75) Inventors: Stefan Hackenbuchner, München (DE); Günther Hirschmann, München (DE)

(73) Assignee: Patent-Treuhand-Gesellschaft fur elektrische Gluhlampen mbH, Munich (DE)

( * ) Notice: Subject to any disclaimer, the term of this patent is extended or adjusted under 35 U.S.C. 154(b) by 0 days.

(21) Appl. No.: 11/919,391

(22) PCT Filed: Apr. 27, 2006

(86) PCT No.: PCT/DE2006/000736

§ 371 (c)(1),
(2), (4) Date: Nov. 2, 2007

(87) PCT Pub. No.: WO2006/119726

PCT Pub. Date: Nov. 16, 2006

(65) Prior Publication Data
US 2008/0214023 A1     Sep. 4, 2008

(30) Foreign Application Priority Data
May 9, 2005   (GB) ................. 102005021728.1

(51) Int. Cl.
*H01R 13/66* (2006.01)

(52) U.S. Cl. ................................. 439/620.02

(58) Field of Classification Search ........... 439/620.02, 439/611, 617, 934; 313/318.05, 318.06, 313/325
See application file for complete search history.

(56) References Cited

U.S. PATENT DOCUMENTS

| | | | | |
|---|---|---|---|---|
| 3,349,277 A | * | 10/1967 | Ter Hoeve | 313/318.01 |
| 4,418,973 A | * | 12/1983 | Smetana et al. | 439/168 |
| 4,586,113 A | * | 4/1986 | Tsuyama | 362/473 |
| 4,752,242 A | * | 6/1988 | Yoshimura | 439/620.02 |
| 4,853,583 A | * | 8/1989 | Ridders et al. | 313/318.02 |
| 5,039,909 A | * | 8/1991 | Kiesling et al. | 313/623 |
| 5,094,628 A | * | 3/1992 | Kano | 439/620.04 |
| 5,814,927 A | * | 9/1998 | Chen | 313/318.03 |
| 5,952,773 A | * | 9/1999 | Manders et al. | 313/318.09 |
| 6,011,347 A | * | 1/2000 | Wittmann | 313/318.09 |

(Continued)

FOREIGN PATENT DOCUMENTS

WO   WO 2005/022576 A   3/2005

*Primary Examiner*—T C Patel
*Assistant Examiner*—Vladimir Imas
(74) *Attorney, Agent, or Firm*—Frishauf, Holtz, Goodman & Chick, P.C.

(57) ABSTRACT

The invention relates to a lamp base (2) for a high-pressure discharge lamp with a printed circuit board (30) mounted inside and populated with electrical components and printed conductors (31) for electrically contacting the components. At least one electrical contact (33) is mounted on the printed circuit board (30) for current supply (16) to the lamp, and at least one partition (24, 25) is provided for electrical insulation between the at least one electrical contact (33) or current supply (16) and the printed conductors (31) on the printed circuit board (30).

12 Claims, 3 Drawing Sheets

U.S. PATENT DOCUMENTS

Figure 1:
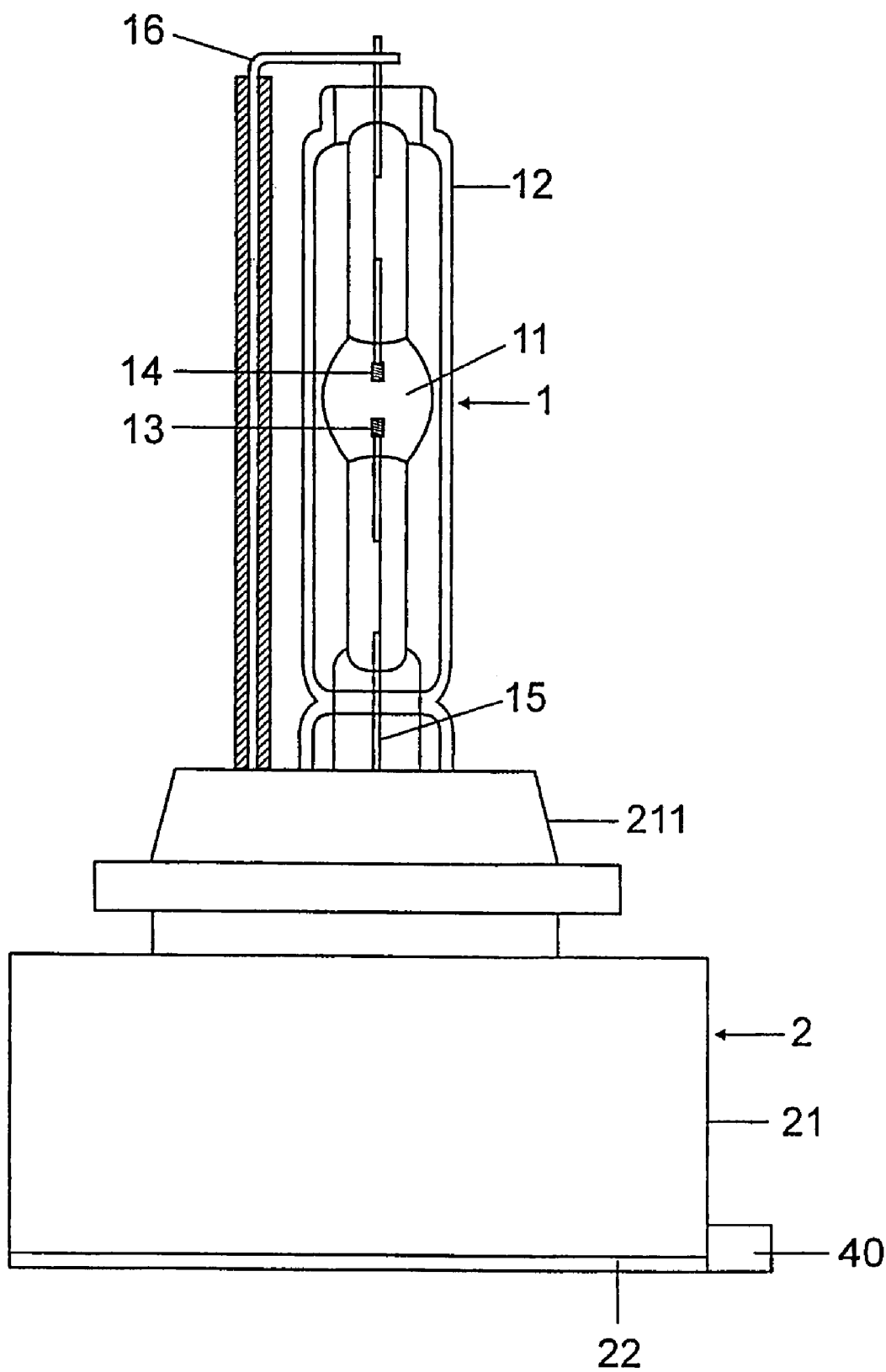

| | | | |
|---|---|---|---|
| 6,049,163 A * | 4/2000 | Masuda et al. | 313/318.12 |
| 6,345,997 B1 | 2/2002 | Shon | |
| 6,641,418 B2 * | 11/2003 | Takahashi et al. | 439/226 |
| 7,040,925 B2 * | 5/2006 | Beerwerth et al. | 439/620.02 |
| 2004/0066150 A1 * | 4/2004 | Neumeier et al. | 315/276 |
| 2004/0164686 A1 * | 8/2004 | Baarman | 315/244 |
| 2005/0030743 A1 * | 2/2005 | Nagano et al. | 362/226 |
| 2005/0196997 A1 * | 9/2005 | Nagano et al. | 439/336 |
| 2005/0243568 A1 * | 11/2005 | Rodriguez Barros et al. | 362/494 |
| 2006/0076869 A1 * | 4/2006 | Marien et al. | 313/317 |
| 2008/0214023 A1 * | 9/2008 | Hackenbuchner et al. | 439/56 |

* cited by examiner

LAMP BASE AND HIGH-PRESSURE DISCHARGE LAMP WITH BASE

This application is a U.S. National Phase Application under 35 USC 371 of International Application PCT/DE2006/000736, filed Apr. 27, 2006, which is incorporated herein in its entirety by this reference.

The invention relates to a lamp base in accordance with the precharacterizing clause of patent claim 1 and to a high-pressure discharge lamp with such a lamp base.

I. PRIOR ART

Such a lamp base has been disclosed, for example, in the laid-open specification WO 2005/022576. This document describes a high-pressure discharge lamp for a motor vehicle headlamp with an ignition device arranged in the lamp base whose component parts are mounted on a printed circuit board. The power supply line, which is routed back from that end of the discharge vessel which is remote from the base to the base, is connected to an electrical contact of the printed circuit board.

It has been shown that, during the ignition phase of the high-pressure discharge lamp, high voltages can occur at the abovementioned power supply line, which is generally at ground reference potential, which high voltages result in electrical flashovers between this power supply line and the conductor tracks on the printed circuit board. The abovementioned high voltages are caused during the ignition phase of the high-pressure discharge lamp by radio interference suppression inductors, which are connected to the power supply line.

II. DESCRIPTION OF THE INVENTION

The object of the invention is to provide a lamp base of the generic type and a high-pressure discharge lamp with improved insulation between the conductor tracks running on the printed circuit board and the power supply line, which is connected to an electrical contact on the printed circuit board, of the lamp.

This object is achieved according to the invention by the features of patent claim 1. Particularly advantageous embodiments of the invention are described in the dependent patent claims.

The lamp base according to the invention has a printed circuit board, which is arranged in its interior, is populated with electrical component parts and is provided with conductor tracks for making electrical contact with the component parts, at least one electrical contact for a power supply line of the high-pressure discharge lamp being arranged on the printed circuit board. According to the invention, at least one partition is provided for electrical insulation purposes between the at least one electrical contact or the power supply line and the conductor tracks of the printed circuit board. As a result, in particular during the ignition phase of the high-pressure discharge lamp, electrical flashovers between the power supply line and the conductor tracks on the printed circuit board are avoided.

Advantageously, the at least one partition protrudes out of the plane of the printed circuit board for the abovementioned purpose and is arranged between the electrical contact of the at least one power supply line and one or more conductor tracks adjacent thereto. Preferably, the at least one partition at least partially surrounds the electrical contact on the printed circuit board in order to avoid electrical flashovers between the at least one power supply line and the conductor tracks adjacent to the electrical contact. The height of the at least one partition above the printed circuit board is preferably at least 5 millimeters in order to ensure a dielectric strength of 10 000 volts.

The at least one partition is advantageously integrally formed on a wall of the lamp base and protrudes through a slot in the printed circuit board. As a result, the production and fitting of the printed circuit board are simplified. In accordance with the preferred exemplary embodiment of the invention, the at least one partition is integrally formed on a cover of the lamp base and protrudes through a slot in the printed circuit board. As a result, the at least one partition is only mounted in the lamp base once the printed circuit board populated with the electrical component parts has been fitted, when the lamp base is sealed by means of the cover, so that it does not cause any hindrance whilst populating the printed circuit board with the electrical component parts and while mounting the printed circuit board in the lamp base.

The printed circuit board is preferably in the form of a lead frame in order to withstand the high operating temperatures in the lamp base.

III. DESCRIPTION OF THE PREFERRED EXEMPLARY EMBODIMENT

Figure 2:
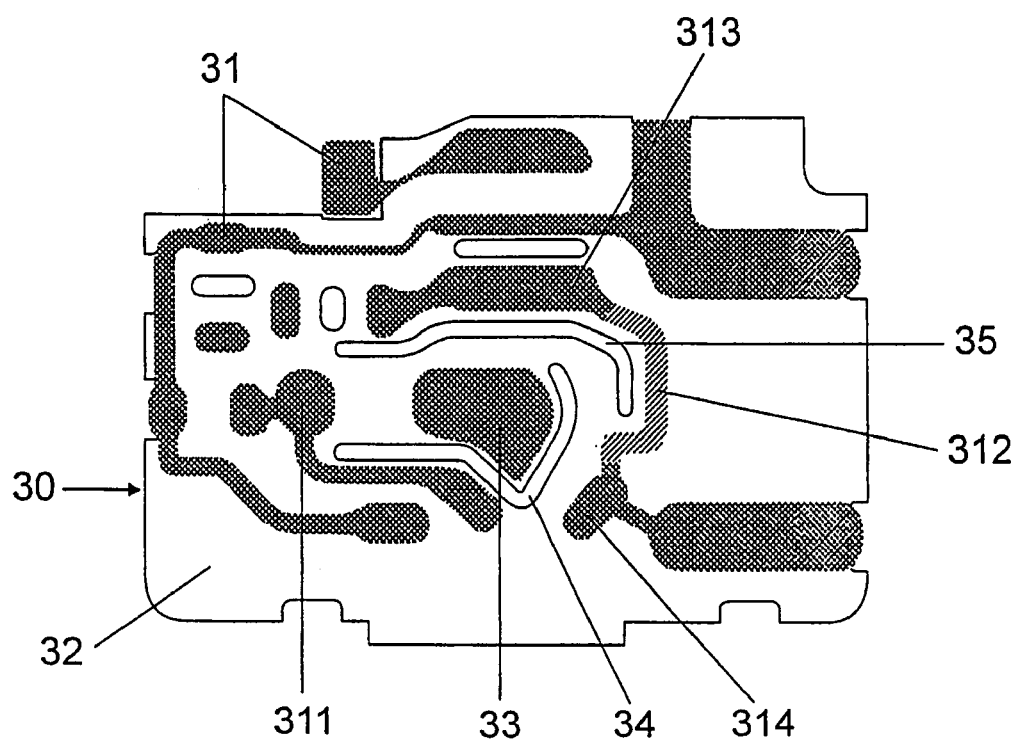
Figure 3:
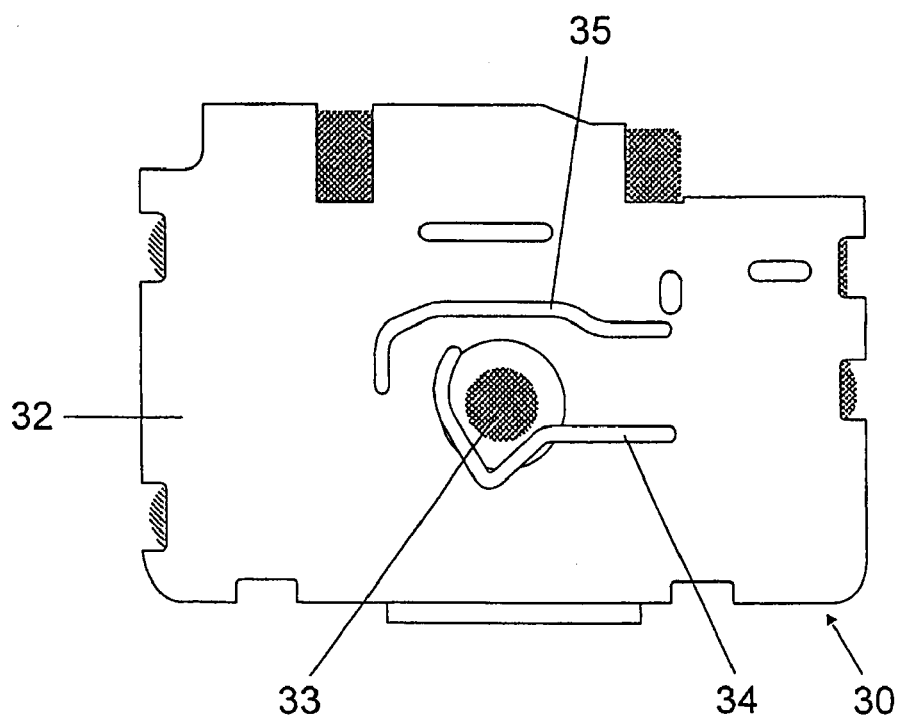
Figure 4:
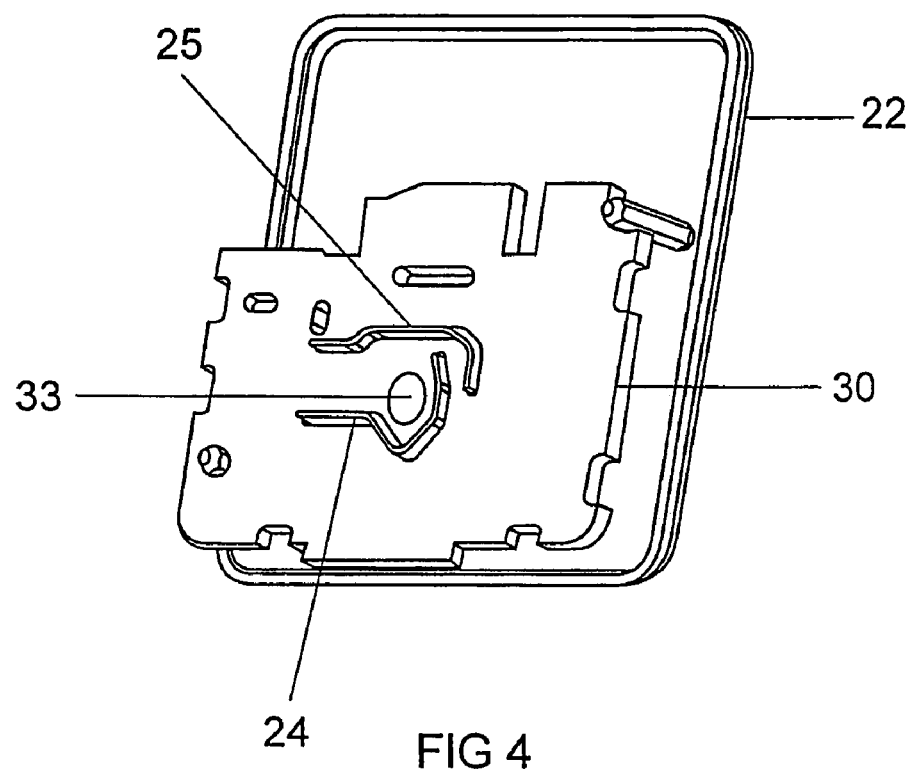
Figure 5:
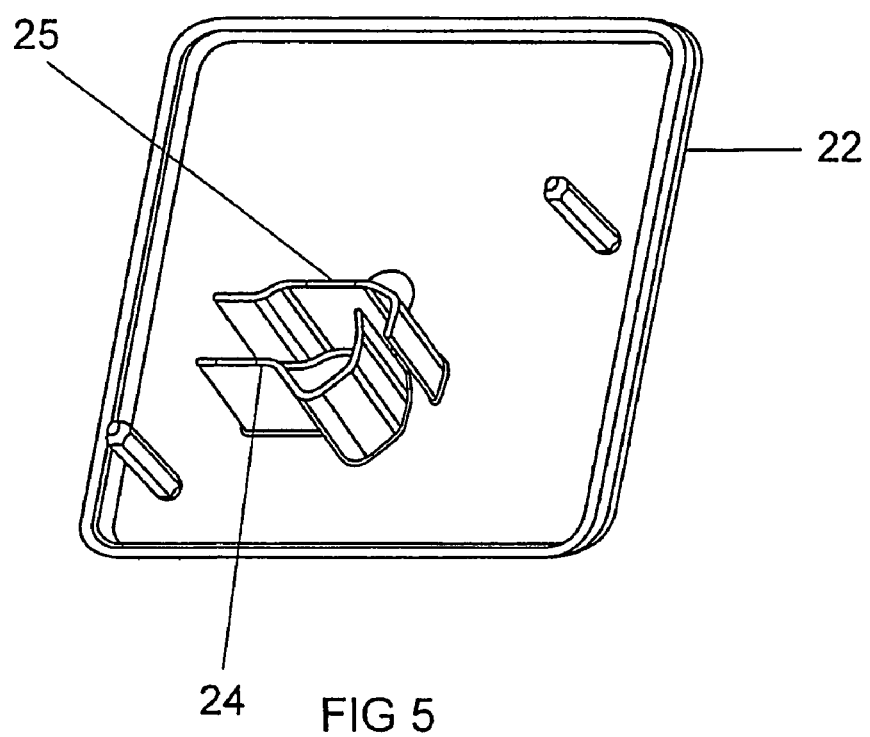

The invention will be explained in more detail below with reference to a preferred exemplary embodiment. In the drawing:

FIG. 1 shows a side view of a high-pressure discharge lamp with a lamp base in accordance with the preferred exemplary embodiment of the invention, FIG. 2 shows a plan view of the front side of the lead frame arranged in the lamp base with its conductor tracks, but without any electrical component parts, FIG. 3 shows a plan view of the rear side of the lead frame depicted in FIG. 2, FIG. 4 shows a plan view of the lead frame and the cover of the lamp base in order to illustrate the interengagement of the partitions integrally formed on the cover and the slots arranged in the lead frame, and FIG. 5 shows a plan view of the cover shown in FIG. 4 with the integrally formed partitions.

FIG. 1 depicts a high-pressure discharge lamp with a lamp base in accordance with the preferred exemplary embodiment of the invention. This high-pressure discharge lamp is a metal-halide high-pressure discharge lamp with a pulsed ignition device integrated in the lamp base. This high-pressure discharge lamp is intended for use as a light source in a motor vehicle headlamp.

The high-pressure discharge lamp has a discharge vessel 11 which is surrounded by a vitreous outer bulb 12, consists of quartz glass and has electrodes 13, 14 arranged therein for producing a gas discharge. The electrodes 13, 14 are each connected to a power supply line 15 and 16, respectively, which are passed out of the discharge vessel 11 and via which they are supplied with electrical energy. The structural unit 1 comprising the discharge vessel 11 and the outer bulb 12 is fixed in the lamp base 2. The lamp base 2 comprises a housing part 21 and a cover 22, which closes the chambers of the housing part 21, and a plug socket 40 for supplying voltage to the high-pressure discharge lamp.

An ignition device in the form of a pulsed ignition device for igniting the gas discharge in the high-pressure discharge lamp is arranged within the housing part 21. The pulsed ignition device comprises an ignition transformer, a spark gap and an ignition capacitor. During the ignition phase of the high-pressure discharge lamp, the ignition capacitor is charged to the breakdown voltage of the spark gap. During the electrical breakdown of the spark gap, the ignition capacitor is discharged via the primary winding of the ignition transformer, so that the high voltage pulses required for igniting the gas discharge in the high-pressure discharge lamp are induced at its secondary winding. The electrical component parts of this ignition device and in addition also one or two radio interference suppression inductors are mounted on a printed circuit board 30 in the form of a lead frame. The lead frame 30 comprises a large number of metal webs 31, which are embedded in electrically insulating plastic material 32 by means of injection molding. The metal webs 31 form conductor tracks for the component parts (not depicted) mounted on the lead frame 30. FIG. 2 shows the front side or mounting side of the lead frame 30 with the conductor tracks 31 running on the upper side and the electrical contact 33, which is used for making contact with the power supply line 16 on the lead frame 30. FIG. 3 depicts the rear side of the lead frame 30, which faces the cover 22 of the lamp base 2.

The lead frame 30 has two apertures or slots 34, 35 in the plastic material 32, which surround the electrical contact 33 on three sides. Two partitions 24, 25 protrude through these slots 34, 35 and are integrally formed on the inner side of the cover 22. Once the lead frame 30 populated with the electrical component parts of the ignition device has been mounted in the housing part 21 and the cover 22 has been plugged on, the partitions 24, 25 protrude through the slots in the lead frame 30, so that the partitions 24, 25 have a height of 6 millimeters above the front side or mounting face of the lead frame 30 which is remote from the cover 22. FIG. 5 shows the inside of the plastic cover 22 with the integrally formed partitions 24, 25, which likewise consist of plastic. FIG. 4 depicts the lead frame 30 (without conductor tracks) and the inside of the cover 22 with the integrally formed partitions 24, 25. The cover 22 and the partitions 24, 25 are in the form of an injection-molded part. The partitions 24, 25 form a chamber which is open on one side. The opening of this chamber is selected such that sufficient space remains for a radio interference suppression inductor on the lead frame 30, which inductor is connected to the electrical contact 33 and the adjacent conductor track 311.

In order to provide sufficient space on the lead frame 30 for all the component parts of the ignition device, the conductor tracks 31 are arranged on the front and rear side of the lead frame 30. FIG. 2 illustrates, schematically, a metal web 312, which is in the form of a deep-drawn part, which connects the two conductor tracks 313, 314 to one another and is embedded completely in the plastic material 32 of the lead frame 30. It has therefore been provided with a different hatching in FIG. 2 than the other conductor tracks because it is covered by the plastic material 32 and is normally not visible on the front side. As a result, sufficient space is provided on the front side of the lead frame 30 for the ignition capacitor of the pulsed ignition device to be mounted.

The invention claimed is:

1. A lamp base for a high-pressure discharge lamp, the lamp base comprising a housing with an interior and a cover which closes the housing, and a printed circuit board, which is arranged in the housing interior, the printed circuit board is populated with electrical component parts and is provided with conductor tracks for making electrical contact with the component parts, at least one electrical contact for a power supply line of the high-pressure discharge lamp being arranged on the printed circuit board, at least one partition is provided for electrical insulation purposes between the at least one electrical contact or the power supply line and the conductor tracks of the printed circuit board and wherein said at least one partition protrudes out of the plane of said printed circuit board, is arranged between said at least one electrical contact for the power supply line and one or more conductor tracks, only partially surrounds said at least one electrical contact for the power supply line, and forms a chamber which is open on one side.

2. The lamp base as claimed in claim 1, characterized in that the height of the at least one partition (24, 25) above the printed circuit board (30) is at least 5 millimeters.

3. The lamp base as claimed in claim 1, characterized in that the at least one partition (24, 25) is integrally formed on a wall of the lamp base (2) and protrudes through a slot (34, 35) in the printed circuit board (30).

4. The lamp base as claimed in claim 1, characterized in that the at least one partition (24, 25) is integrally formed on a cover (22) of the lamp base (2) and protrudes through a slot (34, 35) in the printed circuit board (30).

5. The lamp base as claimed in claim 1, characterized in that the printed circuit board (30) is in the form of a lead frame.

6. A high-pressure discharge lamp with a lamp base as claimed in claim 1.

7. The lamp base as claimed in claim 1, characterized in that the at least one partition (24, 25) at least partially surrounds the electrical contact (33) of the at least one power supply line (16).

8. The lamp base as claimed in claim 7, characterized in that the height of the at least one partition (24, 25) above the printed circuit board (30) is at least 5 millimeters.

9. The lamp base as claimed in claim 8, characterized in that the at least one partition (24, 25) is integrally formed on a wall of the lamp base (2) and protrudes through a slot (34, 35) in the printed circuit board (30).

10. The lamp base as claimed in claim 9, characterized in that the at least one partition (24, 25) is integrally formed on a cover (22) of the lamp base (2) and protrudes through a slot (34, 35) in the printed circuit board (30).

11. The lamp base as claimed in claim 10, characterized in that the printed circuit board (30) is in the form of a lead frame.

12. A high-pressure discharge lamp with a lamp base as claimed in claim 11.

* * * * *

UNITED STATES PATENT AND TRADEMARK OFFICE
CERTIFICATE OF CORRECTION

PATENT NO.        : 7,625,237 B2
APPLICATION NO.   : 11/919391
DATED             : December 1, 2009
INVENTOR(S)       : Stefan Hackenbuchner It is certified that error appears in the above-identified patent and that said Letters Patent is hereby corrected as shown below:

On the Title page:

Under Item (30) Foreign Application Priority Data;

change "May 9, 2005 (GB) .............102005021728.1"

to --May 9, 2005 (DE) ..........102005021728.1--.

Signed and Sealed this
Twelfth Day of June, 2012

David J. Kappos
*Director of the United States Patent and Trademark Office*